US009007105B2

(12) United States Patent
Jenkins

(10) Patent No.: US 9,007,105 B2
(45) Date of Patent: Apr. 14, 2015

(54) HITLESS SWITCHING PHASE-LOCKED LOOP

(71) Applicant: Julian Jenkins, Kurraba Point (AU)

(72) Inventor: Julian Jenkins, Kurraba Point (AU)

(73) Assignee: Perceptia Devices Australia Pty Ltd, Kurraba Point, NSW (AU)

( * ) Notice: Subject to any disclaimer, the term of this patent is extended or adjusted under 35 U.S.C. 154(b) by 0 days.

(21) Appl. No.: 14/167,871

(22) Filed: Jan. 29, 2014

(65) Prior Publication Data

US 2014/0210525 A1    Jul. 31, 2014

(30) Foreign Application Priority Data

Jan. 29, 2013 (AU) .............................. 2013900267

(51) Int. Cl.
*H03L 7/16* (2006.01)
*H03L 7/197* (2006.01)
*H03L 7/087* (2006.01)

(52) U.S. Cl.
CPC .............. *H03L 7/1976* (2013.01); *H03L 7/087* (2013.01); *H03L 7/16* (2013.01); *H03L 2207/50* (2013.01)

(58) Field of Classification Search
CPC ......... H03L 7/1976; H03L 7/16; H03L 7/087; H03L 2207/50
USPC ......... 327/150, 146, 147, 148, 149, 155, 156, 327/157, 158, 159
See application file for complete search history.

(56) References Cited

U.S. PATENT DOCUMENTS

| 7,463,710 | B2 * | 12/2008 | Walsh et al. .................. 375/376 |
| 7,496,168 | B2 * | 2/2009 | Leonowich et al. .......... 375/376 |
| 2009/0256601 | A1 * | 10/2009 | Zhang et al. .................. 327/156 |
| 2011/0156773 | A1 * | 6/2011 | Beccue ......................... 327/156 |
| 2013/0147531 | A1 * | 6/2013 | Lee et al. ...................... 327/158 |

OTHER PUBLICATIONS

Staszewski, Robert Bogdan et al., "Phase-Domain All-Digital Phase-Locked Loop", IEEE Transactions on Circuits and Systems-II: Express Briefs, pp. 159-163, vol. 52, No. 3, Mar. 2005, USA.
Syllaios Ioannis L. et al., "Time-Domain Modeling of a Phase-Domain All-Digital Phase-Locked Loop for RF Applications", IEEE 2007 Custom Integrated Circuits Conference (CICC), pp. 861-864, Feb. 2007, USA.
Staszewski, Robert Bogdan, "State-of-the-Art and Future Directions of High-Performance All-Digital Frequency Synthesis in Nanometer CMOS", pp. 229-231, unknown IEEE publication 978-1-4244-5309-2/10, 2010, USA.

* cited by examiner

*Primary Examiner* — Jung Kim
(74) *Attorney, Agent, or Firm* — Andre H. Grouwstra

(57) ABSTRACT

A PLL includes an oscillator, multiple time-to-digital converters (TDCs) and a system for the remaining functionality. The TDCs measure the oscillator's phase against respective multiple reference clocks. The system compares the respective measured phases with respective desired phases to obtain phase error signals. One is selected to close the loop. The others are monitored and adjusted when not equal to zero. When a new reference clock must be used, the loop is changed from including the old phase error signal to the new. The old phase error was zero because the loop was in lock, the new phase error is zero because it was monitored and adjusted. Therefore, upon switching the loop from the old to the new phase error signal, the loop remains locked and switching is hitless.

12 Claims, 5 Drawing Sheets

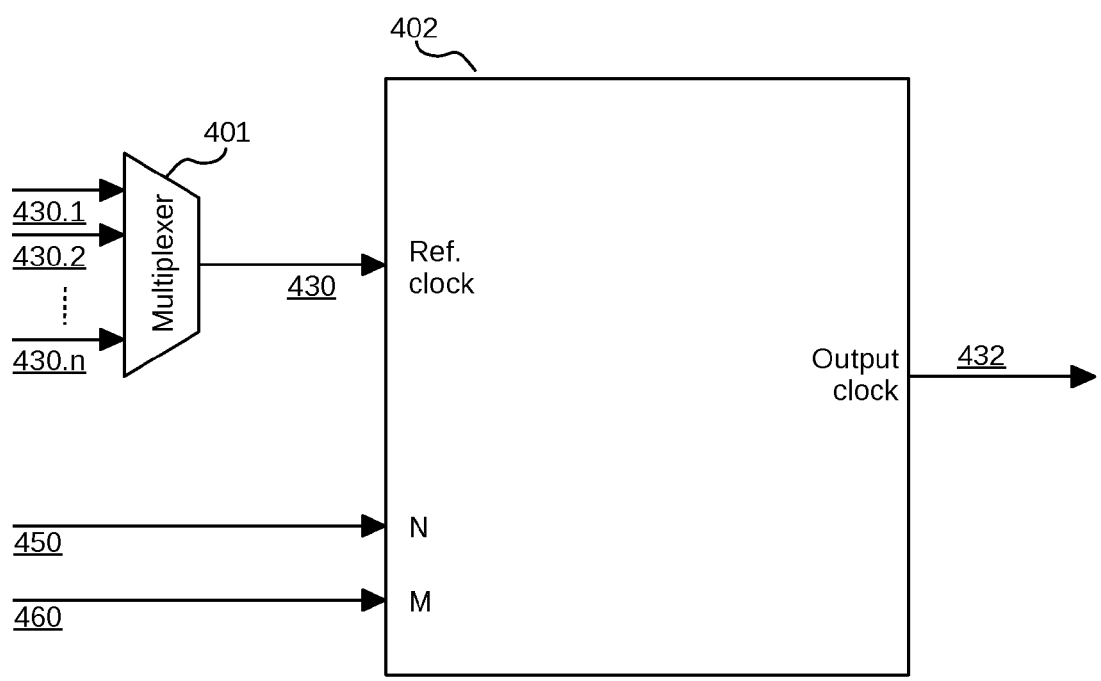
Figure 4 – Prior Art

HITLESS SWITCHING PHASE-LOCKED LOOP

CROSS REFERENCES TO RELATED APPLICATIONS

This application claims priority from Australian Provisional Patent Application Serial No. 2013900267, entitled Apparatuses for Frequency Multiplication, Phase Locked Loops, and Hitless Switching Systems, filed on Jan. 29, 2013, which is hereby incorporated by reference herein for all purposes.

This application is related to the following application, U.S. patent application Ser. No. 14/155,226, entitled Delay Fabric Apparatus and Delay Line, filed on Jan. 14, 2014, which is hereby incorporated by reference, as if set forth in full in this specification.

This application is related to the U.S. patent application Ser. No. 14/167,852 entitled A Phase-Locked Loop Apparatus and Method, filed concurrently with this application on Jan. 29, 2014.

BACKGROUND

The present invention relates generally to electronic circuits used to generate clock signals and in particular to digital phase-locked loops (PLLs) and fractional-N PLLs.

A phase-locked loop (PLL) is a system that generates an output signal whose phase is in lock with that of a reference signal. Because phase is the integral of frequency over time, the frequency relationship between the input and output signals is guaranteed when the PLL is locked. The output signal is obtained from an oscillator whose frequency can be controlled, usually by a voltage or current in analog systems, or by a digital code in digital systems. By comparing the phases of the output signal and the reference signal, a control parameter is obtained. The control parameter can adjust the oscillator frequency upward if it is too low compared to the reference frequency, or downward if it is too high. It is typically filtered by a low-pass filter to prevent that the oscillator changes too quickly.

The output frequency of a PLL may be a multiple of the reference frequency. To achieve this, a divider is inserted in the feedback loop. For instance, a divide-by-two block achieves that the output frequency equals twice the reference frequency. In general, dividing by N achieves that the output frequency equals N times the reference frequency. Dividers may be fixed, but are usually programmable. It is very easy to build a digital circuit that divides a frequency by an integer number, hence the most common class of PLLs is called integer-N. A disadvantage of integer-N PLLs is that the frequency resolution is low. The minimum distance between two frequencies that can be programmed equals the reference frequency. Using a reference frequency that is too low results in unacceptable jitter.

It is also possible, but more complicated, to divide by a non-integer number. The class of PLLs with this capability is called fractional-N PLLs. Non-integer division is often achieved with an integer divider, by programming it at the nearest higher integer for part of the time, and at the nearest lower integer for another part of the time. The partitioning of the time determines the average fraction. While yanking up or down the resulting control parameter can cause jitter of the oscillator, this can be reduced by the loop filter. However, the loop filter also limits the ability of a PLL to respond fast, e.g. the time to first lock to a reference frequency or the timely ability to follow changes in the reference frequency, and for some applications response time and jitter requirements can not be met by this approach.

Another PLL architecture uses a time-to-digital converter (TDC) in the feedback loop. A TDC can count the number of pulses of the output signal during a cycle of the reference signal. Again, achieving integer precision is easy. A TDC can be designed with fractional precision, too, enabling a very low-jitter fractional-N PLL. This approach usually requires a mixed-signal design TDC (partially digital, partially analog). To obtain a high fractional resolution, a TDC may require a lot of parallel fast analog circuitry, and therefore the PLL may dissipate relatively much power. This can create problems in many systems, especially those that are battery-powered.

In some applications, the output clock signal of the PLL must complete the correct number of cycles during a period when lock is lost. Over the time when the PLL is out of lock, the phase error may exceed the period of the reference clock signal. A conventional PLL is unable to track phase errors greater than one reference clock cycle without special additional circuitry, so it will not guarantee that the correct number of cycles have occurred if the phase error exceeds this range.

Some applications use multiple reference signals. This may for instance be the case when the best reference signal is not always available, but there are some backup reference signals that can be used instead. Or the system may have multiple modes, where each mode provides its own reference signal. When a PLL switches reference signals, even those that have the same frequency, it may be temporarily out of lock because the prior and the new reference signal may not have the same phase. To achieve hitless switching, some PLLs may temporarily "loosen" the loop filter to achieve faster lock—at the expense of high jitter—or "tighten up" the loop filter to smooth the transition—at the expense of locking even later.

There is an unmet need to simultaneously achieve high frequency resolution, low jitter, fast response time, tracking arbitrary large phase errors, and low power. There is also an unmet need to achieve hitless switching without losing lock. Embodiments of the present invention address these needs.

SUMMARY

The present invention is directed to a PLL that satisfies these needs. The PLL provides true hitless switching between multiple reference clocks, even when those clocks may have different frequencies, or the desired multiplication factors are different. The PLL comprises an oscillator with a controllable frequency, two or more time-to-digital converters (TDCs), and a system for the remaining functionality. The oscillator frequency is controlled by a control parameter, which is delivered to it by the system.

The TDCs measure the phase of the oscillator frequency against the respective reference clocks, to obtain measured phase values.

The system calculates desired phases based on the respective reference clocks and the respective desired frequency multiplication factors, to obtain respective phase errors. One of the phase error signals is selected for the closed loop, and the system filters it to obtain the control parameter for the oscillator, thereby closing the loop.

The system monitors the other phase error signals to be zero. If one is non-zero, then the system adjusts its respective desired phase value to match the respective measured phase value and sets the phase error to zero.

When the system receives a signal to select a new reference clock, the PLL loop is closed for that new phase error signal and interrupted for the old phase error signal. Since the phase errors for all potential loops were held at zero, the transition is truly hitless. The PLL does not lose lock.

The PLL may be integer-N or fractional-N, meaning that frequency multiplication factors are limited to integers, or may also include fractions in between integers. The PLL may even be configured to specify a fraction that is smaller than the resolution of the TDC.

Whereas the oscillator and the TDCs ordinarily require dedicated hardware, the system may be implemented in dedicated hardware, or its functionality may be performed by a processor.

BRIEF DESCRIPTION OF THE DRAWINGS

The invention will be described with reference to the drawings, in which:

FIG. 4 illustrates a conventional hitless switching PLL system; and

DETAILED DESCRIPTION OF EMBODIMENTS

Apparatuses for frequency multiplication, phase-locked loops and hitless switching systems are disclosed hereinafter. In the following description, numerous specific details, including particular circuit configurations and arithmetic operations, and the like are set forth. However, from this disclosure, it will be apparent to those skilled in the art that modifications and/or substitutions may be made without departing from the scope and spirit of the invention. In some circumstances, specific details may be omitted so as not to obscure the invention.

Embodiments of the invention relate to apparatuses and corresponding methods for frequency multiplication generally and more specifically building a clock-multiplying PLL that generates an output clock signal that has a frequency that is a defined multiple of the reference signal frequency. The multiplication factor can be either an integer or non-integer (fractional) number.

Figure 1:
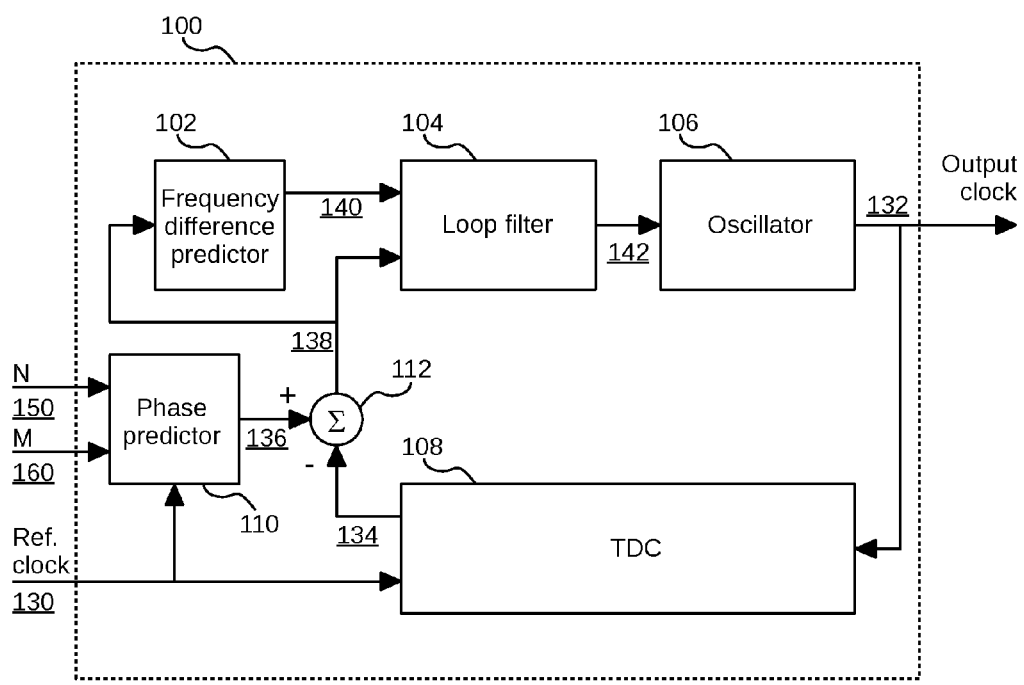
FIG. 1 illustrates a fast locking PLL according to an embodiment of the invention.

FIG. 1 illustrates a fast locking digital PLL 100 according to an embodiment of the invention. When PLL 100 is in lock, its output signal 132 has a frequency $f_{out}$ that is a multiple of the frequency $f_{ref}$ of its input reference clock signal 130. This multiple may be programmed by two parameters, N and M. Parameter N stands for the integer part of the multiple. Its range is $R_N$, and N can have any integer value from 0 to $R_N-1$. Parameter M stands for the fractional part of the multiple. Its range is $R_M$, so M can have any integer value from 0 to $R_M-1$. The multiplication factor of the PLL 100 is determined by $f_{out}=(N+M/R_M)\times f_{ref}$.

The phase of output signal 132 of the controlled oscillator 106 is compared to the phase of reference clock signal 130 by time-to-digital converter (TDC) 108. TDC 108 uses reference clock signal 130 to measure the phase of oscillator output signal 132. Output signal 134 of TDC 108 is a digital code representing the number of cycles of oscillator clock signal 132 since the time of the last or an earlier active edge of reference clock signal 110. An embodiment of TDC 108 is described in more detail hereinafter.

On the left of FIG. 1, phase predictor 110, which may be a fully digital circuit, uses inputs representing the integer N (150) and fractional M (160) components of the PLL multiplication ratio to calculate the desired output signal 134 of TDC 108 at a given cycle of reference clock 130. This number tracks the number of cycles of output signal 312 that fit in one cycle of reference clock signal 130. For an integer-N PLL that is locked, the number tracks the value N. For a fractional-N PLL that is locked, the number tracks the value $N+M/R_M$. Phase predictors are described in more detail hereinafter.

Both the TDC 108 and phase predictor 110 need to be able to track the phase of the output clock over a sufficiently large range, K. Naturally, the range needs to be large enough to count N cycles of the oscillator output clock 132 (at its lowest possible frequency) during the period of one cycle of the reference clock 130. To correct large phase errors, or to relock at the correct phase after lock has been temporarily lost, embodiments of the invention may use a large range K, for instance where $K>>R_N$. Therefore, the maximum value of the phase error is not limited by the period of the reference clock signal 130, but by the range of TDC 108 and phase predictor 110. TDC 108 can be designed to measure a large range of phase, and phase predictor 110 can be designed to calculate a large range of phase, if required by an application.

A simple digital subtractor 112 determines the difference in phase between the desired value 136 output by phase predictor 110 and the measured value 134. When PLL 100 is in lock, these two values are very close, with any difference 138 caused only by jitter in the clock signals. While in lock, the average of many samples of 213 approaches zero. When out of lock, signal 138 representing the phase difference can be used by the loop filter 104 as a parameter to adjust the frequency of oscillator output 132 to the desired multiple of the frequency of the reference clock signal 130.

Embodiments include frequency difference predictor 102 to provide a fast time to first lock. Frequency predictor 102 calculates the ratio between the desired multiple of the frequency of reference clock signal 130 and the current frequency of the oscillator output signal 132. The frequency difference predictor 102 does this by determining the rate at which the phase difference 138 from subtractor 112 is changing. The value 140 of frequency difference predictor 102 is used by loop filter 104 to assist in and/or accelerate finding lock. The loop filter may provide different transfer functions for signals 138 and 140, as desired for out-of-lock and in-lock behavior in various applications. Once the PLL is in lock, the rate of change in signal 138 is zero, and therefore the frequency difference prediction 140 is zero. This means that block 102 may provide a secondary function as a lock detector.

The value 140 of frequency difference predictor 102 can also be used to help control the allowed cycle slip by overriding registers inside the phase predictor 110 and choosing the phase offset, from which the error value is calculated, to accelerate lock. Once lock is achieved, cycle slipping is disabled.

If the loop filter 104 uses the output 140 of the frequency difference detector 102 in preference to the phase error 138, then PLL 100 operates as a frequency-locked loop (FLL).

Figure 2:
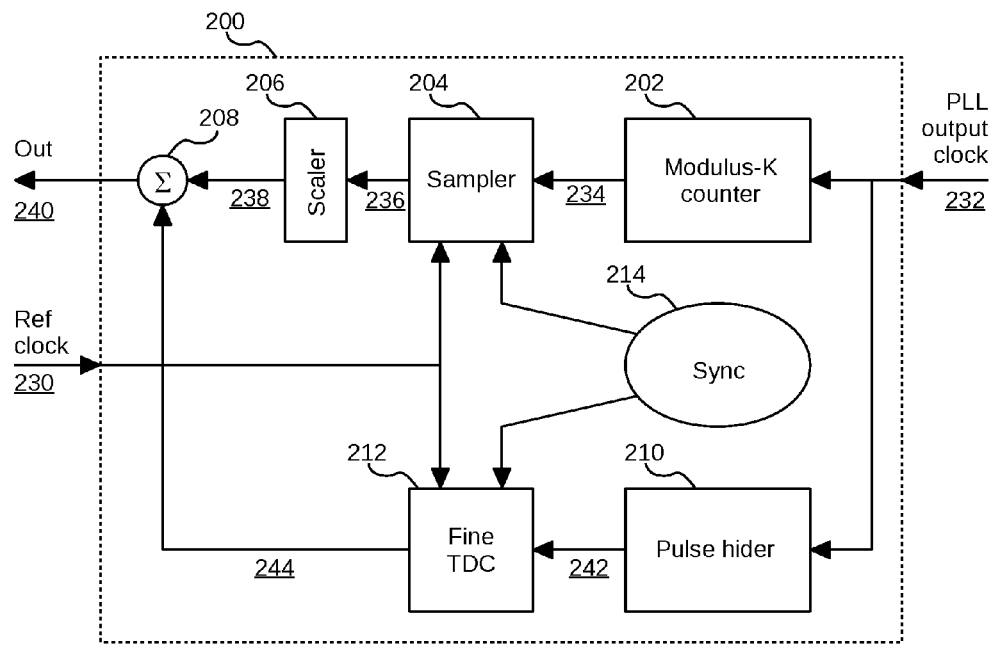
FIG. 2 illustrates a low-power high-resolution time-to-digital converter (TDC) according to an embodiment of the invention.

FIG. 2 illustrates a low-power high-resolution time-to-digital converter (TDC) 200 according to an embodiment of the invention. TDC 200 has two inputs. The first input is for a slow reference clock signal 230. The second input is for a fast clock signal 232. TDC 200 measures the number of cycles of fast clock 232 during at least one cycle of reference clock 230.

The result, with fractional precision, is presented as a digital code at output 240. Given a nominal duration P of the oscillator clock 232, the range of the TDC is approximately K×P, where K is a natural number greater than $R_N$. In some embodiments, K may be much greater than $R_N$.

The fast input clock signal 232 may be provided by output 132 of the oscillator 106 from FIG. 1. The reference clock signal 230 may be provided by reference clock 130 from FIG. 1. The output result 240 then represents the output signal 134 in FIG. 1.

Clock input clock signal 232 is presented to modulus-K counter 202. Modulus-K counter 202 counts the cycles at input 232, starting from 0 and incrementing by one until it reaches the value K−1; the counter returns to 0 the cycle following after K−1, and continues counting. If TDC 200 is applied in PLL 100, then the value K limits the overall maximum value N that PLL 100 can multiply by.

On every active edge of the reference clock signal 230, sampler 204 samples the output 234 of modulus-K counter 202, latching a digital code (an integer number in the range from 0 to K−1). The output 236 of this sampler 204 represents the integer number of completed input clock signal 232 cycles since the prior active edge of reference clock signal 230, modulus K.

In embodiments, active edges of clock signal 230 with respect to sampler 204 may be rising, falling, or both the rising and falling edges.

If TDC 200 is used in PLL 100, K must be chosen to be large enough that the full range of output frequencies of the oscillator 106 can be uniquely identified. For instance, if the oscillator can oscillate at a first frequency that equals J times the reference frequency and at a second frequency that equals (J+K) times the reference frequency, then these two frequencies cannot be distinguished as they produce the same sequence of samples at the output 234 of sampler 204 and, as will become apparent, at output 240 of the TDC. In a practical embodiment of the invention, where modulus-K counter 202 is implemented using binary logic, it may be easiest to choose a power of 2 for the value of K.

Apart from sampler 204, the reference clock signal edge 230 also triggers fine TDC 212, to latch a digital code representing the difference in phase between reference clock signal input 230 and the nearest edge of fast clock input signal 232, relayed via signal 242. The fine TDC has resolution of τ and a range of $R_M \times \tau$ (covering at least one period of input signal 232). The number of steps τ that the fine TDC can measure equals $R_M$. The fine TDC output code at 244 represents the fractional portion of an oscillator period.

The fine TDC may be implemented with a delay fabric or a delay line, e.g. such as described in U.S. patent application Ser. No. 14/155,226, entitled Delay Fabric Apparatus and Delay Line.

The sampled value 236 produced by the sampler 204 of the modulus-K counter 202 is multiplied by the number of fine TDC steps in an oscillator cycle in the scaler 206 to produce scaled signal 238. Output signal 244 of fine TDC 212 is added to scaled signal 238 by adder 208 to generate the combined value 240, which is the output of the full TDC 200. Output signal 240 is a representation of both the integer number of clock signal 232 pulses during one cycle of reference clock signal 230, and the remaining fractional part of a cycle of signal 232.

In embodiments of the invention, synchronization block 214 provides inputs to sampler 204 and fine TDC 212 to align fine TDC 212's zero count with the incrementing of the clock pulse. Should there be a time difference, then the measurement function provided by TDC 200 may be discontinuous and non-monotonic.

Pulse hider 210 enables power reduction. The fast clock input signal 232 is gated by pulse hider 210 and only passes through to input 242 of the fine TDC 212 for clock cycles predicted to be near the edge of reference clock signal 230. These are expected when the scaled modulus-K counter output 234 approaches a predicted value. For instance, in PLL 100 this value is available as output code 136 from phase predictor 110. Further, when PLL 100 is far from lock, the fine resolution τ provided by fine TDC 212 is not required. Therefore, since fine TDC 212 is only required during brief periods of time, its input signal 242 may be switched off during the remainder of time. In embodiments where the fine TDC is a high-speed mixed-signal circuit, power consumption may be high when signal edges pass through, and pulse hider 210 saves significant energy. Pulse hider 210 passes through signal 232 to 242 only when PLL 100 is in lock or close to lock, so that full resolution is maintained.

FIGS. 3A-D illustrate embodiments of phase predictors.

Figures 3A, 3B:
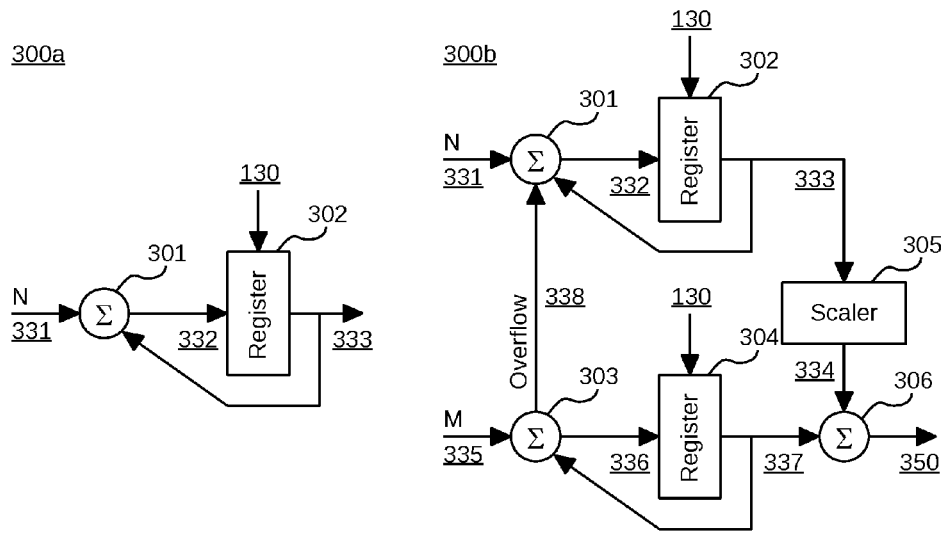
FIGS. 3A-D illustrate embodiments of phase predictors.

FIG. 3A shows a phase predictor 300a in accordance with an embodiment of the invention that can be used when PLL 100 in FIG. 1 acts as an integer-N PLL. In that case, the frequency of oscillator output 132 in FIG. 1 is only allowed to be an integer multiple of the frequency of the reference input 130. This is a simple integer-multiplication implementation of the phase predictor 110. An N-input 331 is provided to a modulus-K summer 301, which in turn is coupled to a register 302. In PLL 100, this register is latched by the active edge of reference clock 130.

Prior to receiving an active edge of reference clock 130, the value in register 302 equals zero and the value at output 332 of adder 301 equals N. When an active edge of the reference clock 130 is received, the value N is latched into register 302. In response, output value 332 of adder 301 will change to (2N mod K). If N is much smaller than K, the result is a series of monotonically increasing predictions of the phase, until K is reached, at which point the next ramp will start. For instance in a PLL where K=64 and N=9, the series of output codes at output 333 of the phase predictor will be 0, 9, 18, 27, 36, 45, 54, 63, 8, 17, etc.

When performing integer multiplication using this circuit, the M-input 160 of FIG. 1 can be omitted—there is no fractional part for an integer-N PLL. Also, referring to FIG. 2, the TDC 200 is reduced to modulus-K counter 202 and sampler 204; the remaining functionality is all dedicated to determining a fractional part, which is not required for integer-N. Blocks 206, 208, 210, 212, and 214 can all be omitted.

FIG. 3B shows a true-fractional-multiplication phase predictor 300b in accordance with another embodiment of the invention. This phase predictor is suited for a fractional-N PLL, or in other words, when the frequency of the PLL 100 output clock signal 132 is allowed to be a number with an integer component and a fractional component times the frequency of the reference clock input 130. Phase predictor 300b calculates the desired phase as a function of N, M, and reference clock 130. The calculation is updated with each active edge of the reference clock.

The circuit 300b calculates the desired phase as a function of N and the reference clock in the same fashion as the circuit 300a. It similarly calculates the desired phase as a function of M and the reference clocks. It combines the results after scaling the prediction of N, in the same fashion as the TDC 200 combines the results of the measurements and the fine measurements. It also adds the capability to increment the N calculation when there is an overflow of M. This capability is not separately required in the TDC 200, where it is inherent.

The components of the integer-N phase predictor as configured in FIG. 3A used in the embodiment shown in FIG. 3B have the same reference numbers, and the description of those components is not repeated here for the sake of brevity. Changes are that the output is now labeled with reference number 350, and an overflow value 338 provided by a summer 303 is additionally provided to the summer 301 in FIG. 3B.

A register 304 and a modulus-$R_M$ summer 303 that can handle the range of values from 0 to $R_M$−1 integrate the fractional component of the M-input 335, clocked by the active edges of reference clock 130. Summer 303 is coupled to the register 304 to produce a series of desired fractional phase values 337 output by the register 304. The summer 303 also produces an overflow signal 338 that indicates that the predicted phase has overlapped an oscillator clock boundary and the clock cycle integrator comprising summer 301 and register 302 should be incremented.

It is notable that the code value 333 in FIG. 3B provides a prediction for the output value 236 of sampler 204 in FIG. 2, and that the code value 337 in FIG. 3B provides a prediction for the output value 244 of fine TDC 212 in FIG. 2. Scaler 305 and summer 306 in FIG. 3B mimic the functionality of scaler 206 and summer 208 in FIG. 2. It is also noteworthy that the combined scaling and adding function can be implemented as a hardware concatenation of bits from the high-resolution part (fine TDC or integrated M) to the coarse-resolution part (modulus-K counter or integrated N).

Figure 3C:
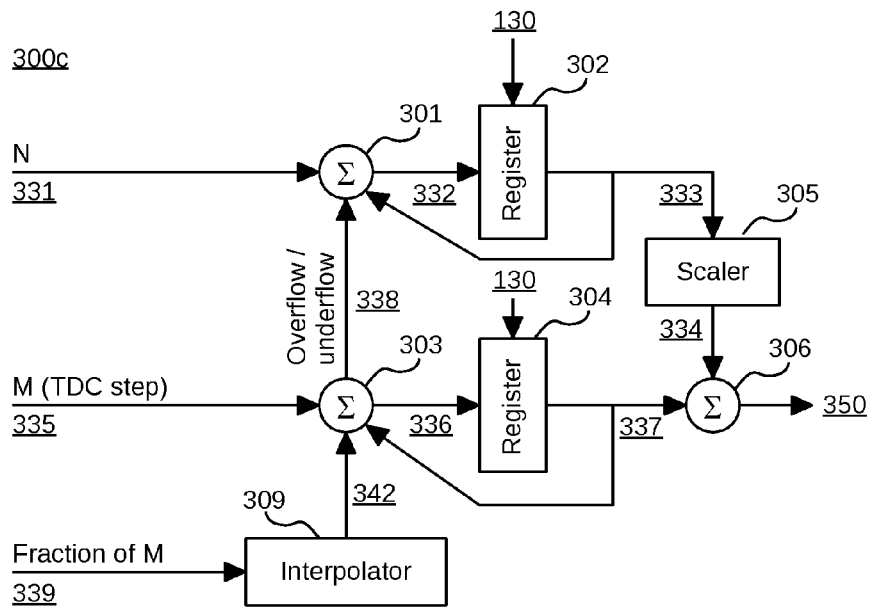

FIG. 3C shows an interpolated-fractional-multiplication phase predictor 300c in accordance with a further embodiment of the invention, that may be used in a PLL 100. With this phase predictor 300c, PLL 100 is capable of generating a frequency at the output clock signal 132 that is a multiple of the frequency of the input reference clock signal 130 with an integer component and a fractional component with arbitrary precision.

The components of the integer-division phase predictor as configured in FIG. 3B used in the embodiment shown in FIG. 3C have the same reference numbers, and the description of those components is not repeated here for the sake of brevity. In addition to the functionality shown in FIG. 3B, FIG. 3C adds interpolator 309, whose output code 342 is coupled with an input of summer 303. The M-input 335 represents the fine TDC step τ, and the input 339 of interpolator 309 represents a fraction of M.

The desired fraction of M 339 is provided to the interpolator 309. The interpolator produces a series of numbers, for instance 0s and 1s, that over time average the desired fraction of M. For instance, to achieve a fraction 0.75, this could be a sequence of 1, 1, 1, 0 that may be repeated indefinitely. The interpolator 309 may also perform noise shaping on the output signal 342. In that case, although the average would remain 0.75, the actual order of the numbers would be randomized or pseudo-randomized. This would move the energy from the jitter caused by the interpolator to move to higher frequencies, where it will be better filtered away by the PLL 100's loop filter 104. Additionally, the interpolator does not need to be limited to using 0s and 1s; it may use other numbers too, including negative numbers. In the latter case, the value 337 at the output of register 304 needs to be decreased. It is possible that this causes an underflow of register 304, meaning it will change from a very small number to a very large number. As a result, signal 338 must be capable of handling an underflow and decrement the signals at 332 and 333 accordingly.

Signal 342 causes the signals 336 and 337 to increase consistent with being incremented by an integer and fractional part. The M-signal 160 from FIG. 1 is broken into a component 335 that is an integer multiple of a TDC step τ and a component 339 that is less than one integer step. In embodiments, interpolator 309 may for instance be implemented using a MASH modulator.

Figure 3D:
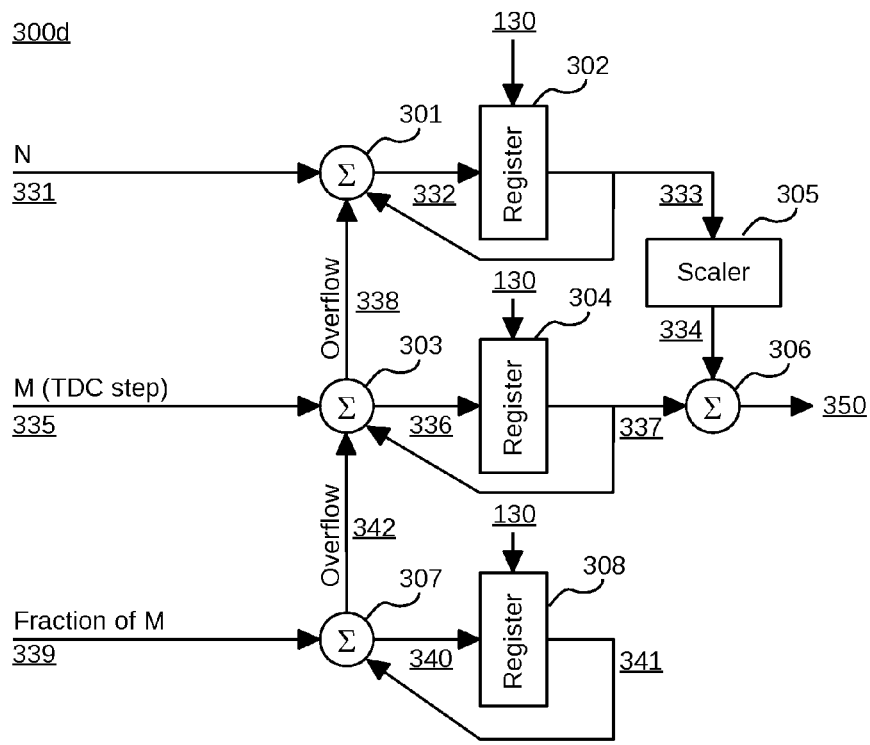

FIG. 3D shows an example of an embodiment of FIG. 3C. In the implementation of FIG. 3D, the interpolator 309 is implemented using a first-order MASH modulator comprising summer 307 and register 308. The fraction of M input 339 is provided to the summer 307. The integrator formed by summer 307 and register 308 accumulates a signal 340, output by summer 307 to the register 308, representing the component phase prediction that is less than a fine TDC step. The output 341 of the register 308 is fed back to the summer 307. The overflow signal 342 output by the summer 307 to the summer 303 causes the output 337 of the TDC prediction integrator comprising summer 303 and register 304 to be incremented when the fractional component adds to more than one TDC step.

Not shown in FIG. 3A-D, all registers 302, 304, 308 and any inside 309 can be optionally overridden to allow adjustment of the desired phase to accelerate lock. For example, if the PLL 100 has adjusted the frequency of the oscillator output 132 to be close to the desired frequency, but the difference 138 to the predicted phase 136 is large, the next prediction could be made based on the measured phase and lock can be achieved quickly compared to having to make a large phase adjustment. Alternatively, the maximum allowed phase error can be limited to be no more than a single cycle or any other value by monitoring the phase error 138 and adding or subtracting from the phase prediction value.

An example PLL 100, according to an embodiment of the invention, performs a true fractional multiplication and demonstrates no jitter. Its parameters are K=256, N=110, M=64, $R_M$=128, and P=128×τ. The PLL multiplies the frequency of the reference clock by 110+64/128=110.5.

In case the PLL is locked, without loss of generality, for a first edge on the reference clock signal 110, a starting TDC output 134 of 0 and a phase prediction 136 of 0 are assumed. On the second edge of the reference clock signal 130, the oscillator output 132 has completed 110.5 cycles, so the output of the modulus-K counter 202 is 110 and the fine TDC output 244 is 64 (half a cycle). The output of the full TDC 240 is thus 110×128+64=14,144 and the phase predictor output is also 0+110×128+64=14,144—the same value. On the third edge of the reference clock signal 130, the oscillator output 232 has completed 221 cycles, so the output 240 of the TDC is 221×128=28,288 and the phase predictor is (110×128+64+ 110×128+64) mod 128×256=221×128=28,288—again the same value. On the fourth edge of the of the reference clock signal 110, the oscillator output 116 has completed 331.5 cycles since the first cycle, the output of the counter 202 has wrapped to 0 on the 256th cycle, so the sampled counter output 234 is 331−256=75 and the output 240 of the TDC is 75×128+64=9,664. The output of the phase predictor is (221× 128+110×128+64) mod 128×256=(331×128+64) mod 128× 256=75×128+64=9,664—again, the same as the output of the TDC.

The example above shows that the error value 138 is zero for all samples and the loop filter 104 does not need to adjust the oscillator 106. If there is a small amount of jitter added to the oscillator output 132, the TDC 108 outputs codes 134 that are a few codes different from the examples above. These small differences appear as inputs 138 to the loop filter 104.

The embodiments of the invention significantly simplify the design of the critical and high-speed components of a clock-multiplying PLL. This allows achieving better accuracy with lower power. The modulus-K counter 202 shown in FIG. 2 can be implemented using a simple counter architecture, without critical paths. The phase predictor 110 of FIG. 1 is a simple digital state machine that has no special timing requirements beyond being complete within one cycle of the reference clock signal—typically much longer than a cycle of the oscillator output clock signal.

Embodiments of the invention are better suited to implementation using modern CMOS manufacturing processes. In these processes, very high frequency PLLs are required, making the implementation of conventional fractional-N dividers sensitive to timing issues and as power hungry as in prior technologies.

In an example, a PLL is designed in a 65-nm process with an output clock signal of 8-GHz. In a conventional PLL design, the programmable divider needs a fixed divide-by-4, implemented as a ripple counter, to produce a 2-GHz clock in order for the remainder of the programmable divider to be able to complete correctly. This makes the frequency multiplication of the PLL, without interpolation, only programmable in steps of 4. In the same technology, a modulus-K counter can be implemented as a ripple counter together with a low-power sampling circuit. This allows frequency multiplication in steps of 1, while using much less power than the conventional implementation.

Comparing a PLL implemented using the phase predictor of FIG. 3C to a conventional PLL where the fractional divide ratio is controlled by a MASH modulator or other interpolator, the phase noise generated by the PLL in accordance with this embodiment of the invention is reduced by a ratio equal to $R_M$. This is because of interpolation between TDC steps instead of oscillator cycles, so the output quantization noise is reduced by the ratio of the oscillator output period to the TDC step size τ.

A PLL according to an embodiment of the invention allows more control of the relationship between the phase of the reference clock signal 130 and the phase of the output clock signal 132. In a conventional PLL, the programmable divider creates an arbitrary phase relationship between the phase of the output clock signal and the phase of the reference clock signal, of a fixed number of cycles of the oscillator. Adjusting the count of the programmable divider to align the feedback clock to the nearest oscillator output edge relative to the reference clock signal is impractical. However, by using the circuitry shown in FIG. 3, control of the phase to match the application is enabled.

Embodiments of the invention can achieve fast lock in a way not possible with conventional PLLs. The output 140 of the frequency difference predictor 102 shown in FIG. 1 can be used by loop filter 104 to quickly achieve frequency lock, although with unknown phase. This frequency lock can be much faster than achieved by a conventional PLL, because the frequency difference can be measured directly and first-order (or greater) loop filter parameters can be used to control frequency. In this mode, the PLL is operating like an FLL (frequency locked loop). This is much faster than relying on the output of a Phase-Frequency-Detector to measure frequency, which generally has a non-linear relationship and can take a long time to lock. Once the output frequency is sufficiently close to the desired frequency, the frequency difference predictor can be disabled and the registers inside the phase predictor 110 can be loaded with values that ensure the phase error 138 is zero on the next cycle. The loop filter 104 uses the calculated phase error 138 to achieve a phase lock. This lock is quickly achieved as the frequency and phase of the oscillator output 132 are close to correct.

The control of phase allowed by embodiments of the invention allows an improved form of hitless switching with minimal phase deviation at the output of the PLL.

FIG. 4 illustrates a conventional hitless switching PLL system 400. It includes a multiplexer 401 and a PLL 402. The multiplexer 401 receives multiple clock signals 430.1-430.n. These clock signals need to be the same frequency, although only one needs to be active at any given time. The multiplexer 401 selects an active clock, under control of the application that includes the hitless switching PLL system 400, and passes it through as the reference clock signal 430 for PLL 402. PLL 402 has inputs for an N code 450 and an M code 460. It generates an oscillator output signal 432. When switching occurs from a first reference clock to a second reference clock (at the 430.1-430.n inputs), generally a phase discontinuity occurs, and PLL 402 may be temporarily out of lock. During this time, it slews from a first lock state to a second lock state. Generally, some precautions are taken to make this slew occur smoothly, and make the transition quasi-hitless, at the expense of increased out-of-lock time.

Figure 5:
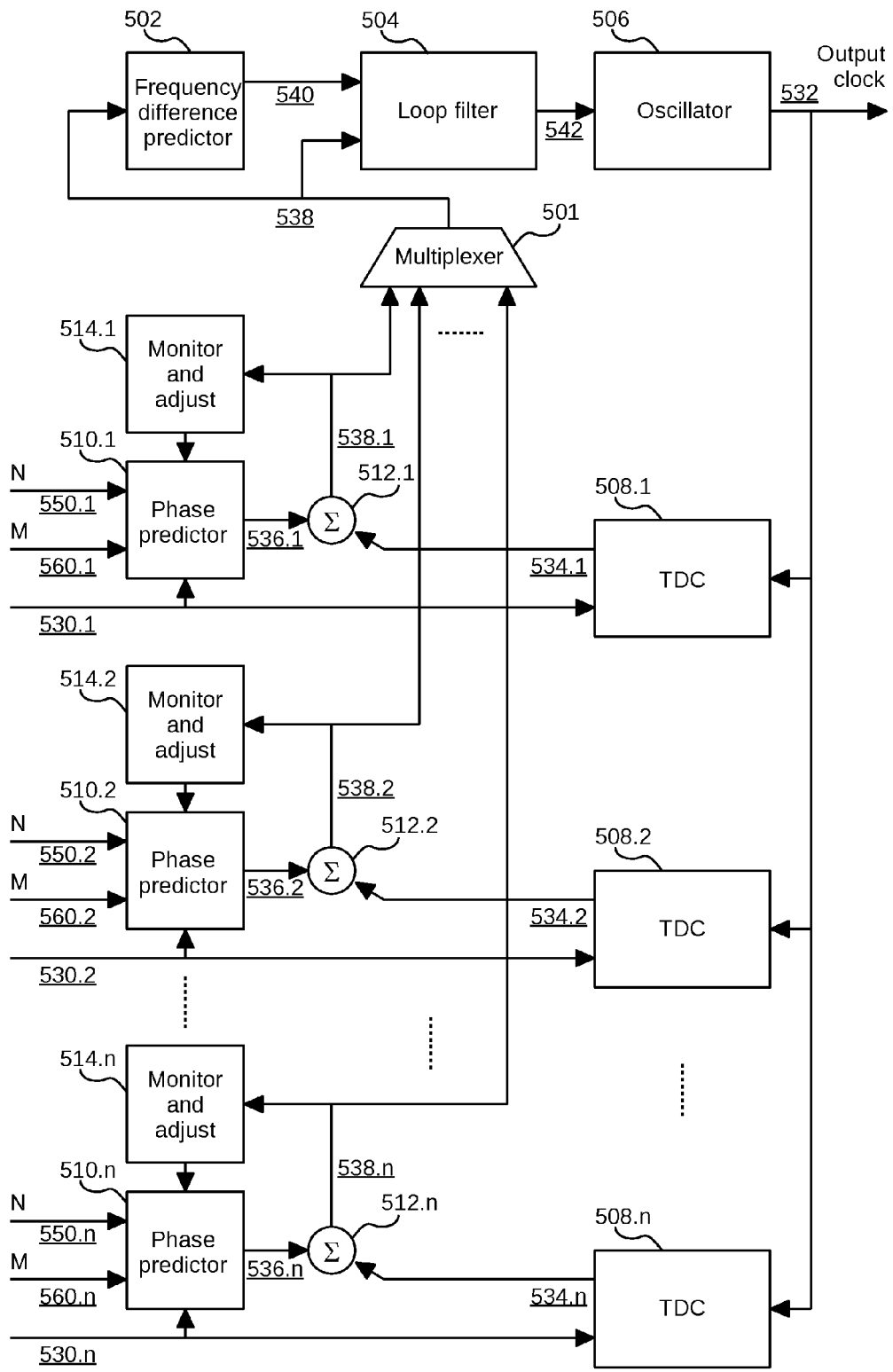
FIG. 5 illustrates a hitless switching fractional-N PLL according to an embodiment of the invention.

FIG. 5 illustrates a hitless switching fractional-N PLL 500 according to an embodiment of the invention. True hitless switching occurs by correcting phase discontinuities that may exist between available input clock signals. In fact, the clock signals 530.1-530.n are not required to have the same frequency, and the N and M parameters 550.1-550.n and 560.1-560.n may be programmed separately for each of the available input clocks.

PLL system 500 includes frequency predictor 502, which is optional for the hitless switching operation, loop filter 504 and oscillator 506, all configured as shown in FIG. 1. The description of those components is not repeated for the sake of brevity. The phase predictors 510.1-510.n, summers 512.1-512.n and TDCs 508.1-508.n are duplicates of the components in FIG. 1 for each input of 530.1 through 530.n. Each input 530.1 through 530.n is coupled with a respective TDC 508.1-508.n, as well as with the respective phase predictor 510.1-510.n. Each phase predictor 510.1-510.n also has an input coupled with a respective monitor-and-adjust block 514.1-514.n. The monitor-and-adjust blocks are active only for those reference clocks that are not selected by multiplexer 501. The blocks monitor the error output signals 538.1-538.n from the respective summers 512.1-512.n and adjust registers (not shown) inside the phase predictor 510.1-510.n to minimize the error signal 538.1-538.n. Multiplexer 501, under control of the application that includes the hitless switching PLL 500, selects one of the signals 538.1-538.n and provides passes it as signal 538 to the loop filter 504 and the optional frequency difference predictor 502. The monitor-and-adjust blocks 514.1-514.n can use a loop filter structure to cause the phase predictor outputs 536.1-536.n to closely match the outputs 534.1-534.n of the TDCs 508.1-508.n provided to the respective summers 512.1-512.n—in this case the monitor-and-adjust blocks 514.1-514.n may also generate a signal (not shown) to indicate which inputs from 530.1-530.n have matching frequencies to the reference clock signal that the PLL is currently locked to. A simpler embodiment of a monitor-and-adjust block 514.1-514.n just copies the output signal 534.1-534.n of the respective TDC 508.1-508.n into the register (not shown) inside the phase predictor 510.1-510.n so that the last prediction is effectively correct.

The monitor-and-adjust blocks 514.1-514.n are enabled only for the phase predictors 510.1-510.n that are not currently used for the active loop through multiplexer 501. Any adjustment in the currently active loop can break the desired relationship between input and output frequency. The function of the monitor-and-adjust blocks is to maintain the minimum phase error of currently unused signal 530.1-530.$n$, and indicate if each of their frequencies is at the desired ratio to the output clock signal.

Once the monitor-and-adjust blocks 514.1-514.$n$ have the error signals 538.1-538.$n$ associated with any valid input clock 530.1-530.$n$ close to zero, multiplexer 501 can be switched to lock PLL 500 to a different reference signal by selecting a different error signal to become the output signal 538 of the multiplexer 501 and disabling the monitor-and-adjust block associated with this error signal. The effective phase error between the prior and the new reference phases is now limited to be of the order of $\tau$ (one fine TDC step), or smaller if the phase predictors 510.1-510.$n$ include interpolators for sub-$\tau$ precision.

In embodiments of the invention, the multiplexer 501 can be replaced by an averaging block that creates an error signal 538 by averaging all the inputs 538.1-538.$n$ that are currently valid and whose monitor-and-adjust blocks 514.1-514.$n$ have the error signals 538.1-538.$n$ associated with any valid input clock 530.1-530.$n$ close to zero. In this case, the PLL output clock signal 532 is effectively locked to all valid inputs and altering the members of the valid set has an even smaller impact on phase.

The circuit of FIG. 5 can easily be optimized to have less circuitry. Similar elements in the diagram may be optimized without changing function. For example, the TDCs 508.1-508.$n$ may share a common modulus-K counter with one sampler for each TDC. Elements of the fine TDC may also be shared between blocks. A further optimization may be to have a single monitor-and-adjust block replacing 514.1-514.$n$ that cycles through the phase predictors 510.1-510.$n$ in turn, adjusting only one at a time.

Those skilled in the art will appreciate that the invention described herein is susceptible to variations and modifications other than those specifically described. For instance, many of the operations can be implemented in a programmable processor or in a programmable logic device, obviating a need for at least part of the dedicated hardware. All such variations and modifications are to be considered within the ambit of the present invention the nature of which is to be determined from the foregoing description.

It will be understood that the invention disclosed and defined in this specification extends to all alternative combinations of two or more of the individual features mentioned or evident from the text or drawings. All of these different combinations constitute various alternative aspects of the invention.

Although the description has been described with respect to particular embodiments thereof, these particular embodiments are merely illustrative, and not restrictive.

Any suitable technology for manufacturing electronic devices can be used to implement the circuits of particular embodiments, including bipolar, JFET, MOS, NMOS, PMOS, CMOS, BiCMOS, HBT, MESFET, FinFET, etc. Different semiconductor materials can be employed, such as silicon, germanium, SiGe, GaAs, InP, graphene, etc. Circuits may have single-ended or differential inputs, and single-ended or differential outputs. Terminals to circuits may function as inputs, outputs, both, or be in a high-impedance state, or they may function to receive supply power, a ground reference, a reference voltage, a reference current, or other. Although the physical processing of signals may be presented in a specific order, this order may be changed in different particular embodiments. In some particular embodiments, multiple elements, devices, or circuits shown as sequential in this specification can be operating in parallel.

Particular embodiments may be implemented in a computer-readable storage medium for use by or in connection with an instruction execution system, apparatus, system, or device. Particular embodiments can be implemented in the form of control logic in software, firmware, hardware or a combination of those. The control logic, when executed by one or more processors, may be operable to perform that which is described in particular embodiments.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope to implement a program or code that can be stored in a machine-readable medium to permit a computer to perform any of the methods described above.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

I claim:

1. A hitless-switching phase-locked loop (PLL), comprising:
    an oscillator with an output having an output signal with a first frequency, where the first frequency is controllable by a first control parameter;
    a first time-to-digital converter (TDC) with a first input coupled to a first reference clock input of the PLL, a second input coupled to the oscillator output, and an output register capable of holding a first measured phase value;
    a second TDC with a first input coupled to a second reference clock input of the PLL, a second input coupled to the oscillator output, and an output register capable of holding a second measured phase value;
    a system configured for:
    calculating a first desired phase value by integrating a first parameter indicating a first desired frequency multiplication factor;
    calculating a second desired phase value by integrating a second parameter indicating a second desired frequency multiplication factor;
    comparing the first measured phase value with the first desired phase value to obtain a first phase error signal;
    comparing the second measured phase value with the second desired phase value to obtain a second phase error signal;
    selecting the first phase error signal;
    filtering the first phase error signal to obtain the first control parameter;
    forwarding the first control parameter to the oscillator;
    monitoring if the second desired phase value closely matches the second measured phase value;

in response to determining a difference between the second desired phase value and the second measured phase value, adjusting the second desired phase value to minimize an error from the second measured phase value;

receiving a reference select signal, the reference select signal indicating that the second reference clock must be used for locking the PLL;

deselecting the first phase error signal;

selecting the second phase error signal;

filtering the second phase error signal to obtain the first control parameter; and forwarding the first control parameter to the oscillator.

2. The PLL of claim 1, wherein:
the first parameter indicating a first desired frequency multiplication factor matches the second parameter indicating a second desired frequency multiplication factor.

3. The PLL of claim 1, wherein:
the first TDC is capable of measuring phase value with fractional precision; and
the first parameter indicating a first desired frequency multiplication factor includes an integer and a fractional component.

4. The PLL of claim 3, wherein the first parameter indicating a first desired frequency multiplication factor further includes a sub-fractional component, the sub-fractional component being included as an average over time.

5. The PLL of claim 1, wherein
the system is capable of copying the second measured phase value as the second desired phase value, and setting the second phase error signal value to zero.

6. The PLL of claim 1, further comprising:
one or more additional TDCs, each with a first input coupled to an additional reference clock input of the PLL, a second input coupled to the oscillator output, and an output register capable of holding an additional measured phase value; and wherein the system is configured for:
calculating each additional desired phase value for the respective reference clock input of the PLL;
comparing each additional desired phase value with the respective measured phase value; and
monitoring and adjusting each additional desired phase value to minimize an error from the respective measured value.

7. The PLL of claim 6, wherein the system comprises a single module for monitoring and adjusting, and the single module is used for each non-selected phase error signals, one at a time.

8. The PLL of claim 1, wherein a counter for the first TDC is combined with a counter for the second TDC.

9. The PLL of claim 1, wherein the first phase error signal and the second phase error signal are selected all the time and both are low-pass filtered to jointly obtain the first control parameter, and wherein only the phase error signal indicated by the reference select signal is not monitored and adjusted.

10. The PLL of claim 1, wherein the system comprises a digital processor coupled with the first TDC, the second TDC, the oscillator, and a processor-readable storage device, wherein the processor-readable storage device includes one or more instructions executable by the digital processor to perform the following acts:
calculating the first desired phase value by integrating the first parameter indicating the first desired frequency multiplication factor;
calculating the second desired phase value by integrating the second parameter indicating the second desired frequency multiplication factor;
comparing the first measured phase value with the first desired phase value to obtain the first phase error signal; and
comparing the second measured phase value with the second desired phase value to obtain the second phase error signal.

11. The PLL of claim 1, wherein the system comprises a digital processor coupled with the TDC, the oscillator, and a processor-readable storage device, wherein the processor-readable storage device includes one or more instructions executable by the digital processor to perform the following act:
filtering a phase error signal to obtain the first control parameter.

12. The PLL of claim 1, wherein the system comprises a digital-to-analog converter followed by an analog loop filter, or a digital loop filter followed by a digital-to-analog converter.

* * * * *